United States Patent
Shrivastava

(10) Patent No.: US 8,604,872 B2
(45) Date of Patent: Dec. 10, 2013

(54) HIGHLY LINEAR, LOW-POWER, TRANSCONDUCTOR

(75) Inventor: Ayaskant Shrivastava, Plano, TX (US)

(73) Assignee: CSR Technology Inc., San Jose, CA (US)

( * ) Notice: Subject to any disclaimer, the term of this patent is extended or adjusted under 35 U.S.C. 154(b) by 50 days.

(21) Appl. No.: 13/308,145

(22) Filed: Nov. 30, 2011

(65) Prior Publication Data

US 2013/0135040 A1     May 30, 2013

(51) Int. Cl.
*H03F 1/34* (2006.01)
(52) U.S. Cl.
USPC .......................................................... 330/85
(58) Field of Classification Search
USPC .......................................... 330/85, 290, 291
See application file for complete search history.

(56) References Cited

U.S. PATENT DOCUMENTS 5,264,806 A * 11/1993 Kobayashi ..................... 330/294
8,149,052 B2 * 4/2012 Huang et al. .................. 330/149

* cited by examiner

*Primary Examiner* — Steven J Mottola
(74) *Attorney, Agent, or Firm* — Fulbright & Jaworski LLP

(57) ABSTRACT

Systems and methods which implement a transconductor replica feedback (TRF) block in a transconductor circuit are shown. In accordance with embodiments, the TRF block comprises a feedback transistor disposed as a replica of a corresponding transconductance transistor of the transconductor circuit. The TRF block provides enhanced looking-in degeneration impedance for the transconductor circuit, thereby allowing for higher linearity and lower power at the same time. TRF transconductors of embodiments can be implemented in, or otherwise applied to, various different circuits such as LNAs, filters, etc.

21 Claims, 3 Drawing Sheets

HIGHLY LINEAR, LOW-POWER, TRANSCONDUCTOR

TECHNICAL FIELD

The invention relates generally to transconductor circuits and, more particularly, to low-power transconductor circuit configurations adapted to provide high linearity.

BACKGROUND OF THE INVENTION

Various system configurations implement circuitry, referred to as transconductor circuits or simply transconductors, which provides change in the output of current corresponding to the change in the input voltage. For example, it is not uncommon to find a transconductor implemented at the input of a circuit, such as a tuner circuit. One relatively common form of transconductor is a transconductance amplifier utilized in a low noise amplifier (LNA) implementation.

Directing attention to FIG. 1, an exemplary transconductor circuit is shown as transconductor 100 wherein transconductance transistor Q1, as biased by bias transistor M2, is adapted to provide transconductance operation as between the input Vin and the output Tout. It should be appreciated that transconductor 100 comprises a double-ended circuit configuration, wherein transconductance transistor Q1 is disposed in a common emitter transistor pair configuration with a corresponding transconductance transistor (not shown) and bias transistor M2 is disposed in a common source pair configuration with a corresponding bias transistor (not shown). However, because the double-ended circuit configuration provides mirror image circuitry to that shown in FIG. 1, the illustration has be simplified to show only one half of the double-ended circuit configuration.

Linear operation (i.e., operation to provide changes in the output current of Tout linearly corresponding to the changes in the input voltage of Vin) of transconductor 100 may be desired in many implementations. For example, relatively high distortion performance, such as may be measured by the third order intercept (IP3), throughout a relatively wide range of input voltage/output current may be desired in the aforementioned LNA transconductance amplifier implementations.

In the transconductor circuit configuration of FIG. 1, the looking-in transconductance at the base of transistor Q1 is gm1, wherein gm1 is the transconductance of the transistor. However, this is highly non-linear. Therefore, a de-generating resistor, shown here as degeneration resistor Re, is provided to somewhat linearize the looking-in transconductance to $1/(1/gm+Re)$, where Re is the resistance of degeneration resistor Re and is linear.

However, using the aforementioned de-generating resistor configuration in the design of a low-noise-amplifier, with a given noise and bandwidth, a relatively high amount of power is consumed to reach a desired distortion (e.g., IP3) performance. That is, since the transconductor comprises a simple common-emitter degenerated bipolar pair, linearity is achieved by decreasing 1/gm vs Re and hence higher current. In particular, to provide linear operation of transconductor 100, higher current is passed through transconductance transistor Q1 thereby reducing 1/gm1 and thus the non-linear component of the total impedance 1/gm1+Re. Such increased current results in more power consumption by the transconductor and, since the drop across the load increases, this also means higher power supply or reduced DC gain. Therefore, beyond a point, it is difficult to lower the power consumption without compromising distortion performance of the transconductor.

Another technique used with respect to the transconductor configuration of FIG. 1 to increase distortion is to increase the resistance provided by degeneration resistor Re. However, this technique incurs greater noise and implies that the load on the transconductor also increases so that DC gain remains the same. Therefore this technique also comes at the cost of increased power consumption and noise/reduced DC gain while also detrimentally impacting the quality factor (Q-factor or Q) of the filter circuit when used with this configuration.

The aforementioned relatively high power operation of such transconductors may present issues with respect to various implementations. For example, the high power operation may be unacceptable or undesirable in circuit configurations wherein limited power is available (e.g., battery operated device implementations, such as cellular telephones, portable entertainment devices, personal digital assistants, etc.). Additionally, such high power operation is generally accompanied by higher circuit component operating temperatures. Thus issues with respect to heat dissipation and circuit packaging (e.g., integrated circuit packaging, integration/separation of additional system circuitry, etc.) may result from the use of such high power techniques.

BRIEF SUMMARY OF THE INVENTION

The present invention is directed to systems and methods which implement a transconductor replica feedback (TRF) block in a transconductor circuit. In accordance with embodiments of the invention, the TRF block comprises a feedback transistor configured as a reduced performance ratio (e.g., 1:M) transistor disposed as a replica of a corresponding transconductance transistor of the transconductor circuit. The TRF block provides enhanced looking-in degeneration impedance for the transconductor circuit, thereby allowing for higher linearity and lower power at the same time. TRF transconductors of embodiments of the invention can, for example, lower power consumption by more than 50%, while providing the same or higher linearity, as compared to corresponding prior art transconductor circuits.

TRF transconductors of embodiments can be implemented in, or otherwise applied to, various different circuits such as LNAs, filters, variable gain amplifiers (VGAs) etc. For example, the TRF block of embodiments is configured such that it has minimal effect on bandwidth and noise figure when used in the design of particular circuitry, such as front end LNA circuitry, while decreasing looking-in impedance at the emitter of the transconductor. Accordingly, the resulting circuitry may be adapted to provide higher linearity in addition to having a higher Q filter through implementation of the TRY transconductor of embodiments.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
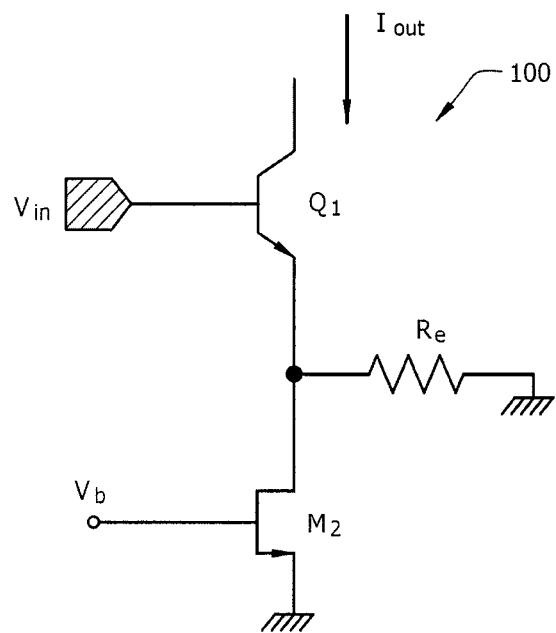
FIG. 1 shows a portion of a prior art transconductor circuit.
Figure 2:
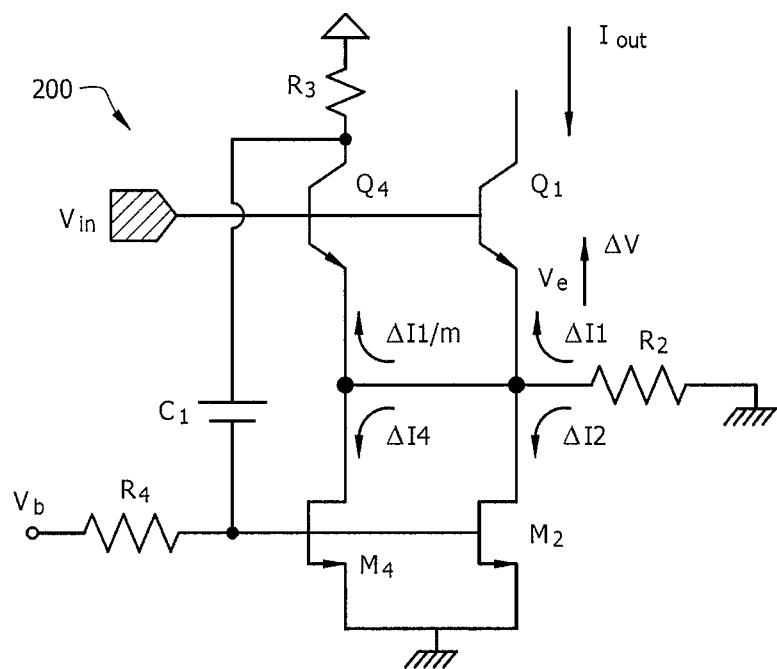
FIG. 2 shows a portion of a transconductor replica feedback transconductor circuit according to embodiments of the invention.

Directing attention to FIG. 2, a TRF transconductor circuit adapted according to embodiments of the invention is shown. Specifically, TRF transconductor 200 is shown wherein transconductance transistor Q1, as biased by bias transistor M2, is adapted to provide transconductance operation as between the input Vin and the output Tout. A de-generating resistor, shown here as degeneration resistor Re, is also shown in the illustrated embodiment of TRF transconductor 200 which cooperates to linearize the looking-in transconductance of the transconductor (i.e., the looking-in transconductance at the emitter). Unlike transconductor 100 of FIG. 1, however, TRF transconductor 200 of FIG. 2 includes a TRF block wherein feedback transistor Q4 provides enhanced looking-in degeneration impedance for the transconductor circuit. In particular, the TRF block of TRF transconductor 200 of the illustrated embodiment comprises feedback transistor Q4 and transimpedance resistor R3 operable to provide low-power, highly linear transconductance operation according to embodiments herein. AC coupling capacitor C1 and AC coupling resistor R4 are provided in the illustrated embodiment to facilitate coupling of the feedback signal to the gates of bias transistors M4 and M2 which are biased by bias voltage Vb.

Although bias transistor M4 is shown in the embodiment of FIG. 2 in order to illustrate current flow helpful in understanding the concepts herein, it should be appreciated that bias transistor M4 is disposed in a shorted configuration with bias transistor M2. Such a configuration of transistors may be implemented as a single transistor, if desired. Accordingly, bias transistors M4 and M2 may be implemented as a single bias transistor according to embodiments of the invention.

Figure 3:
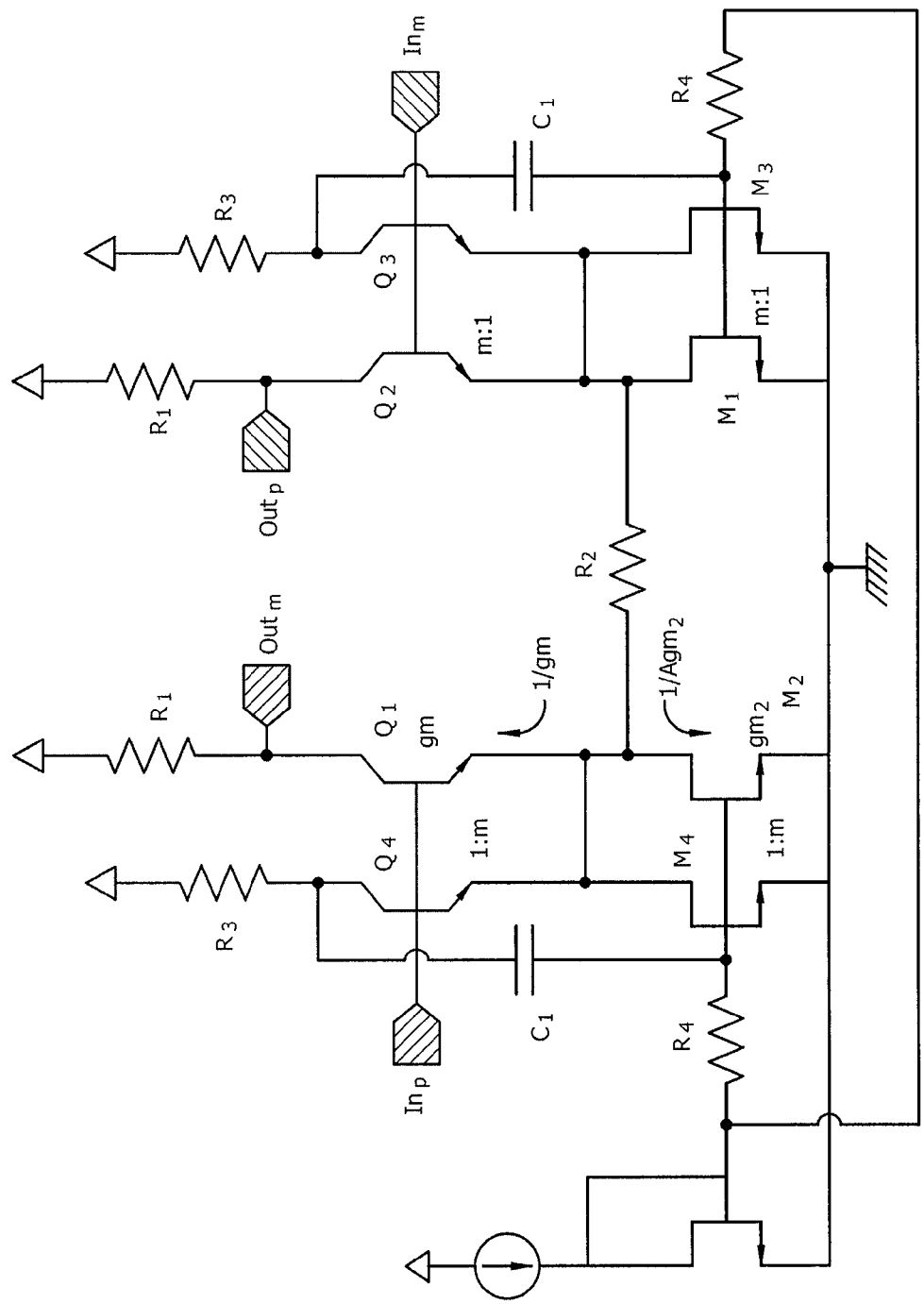
FIG. 3 shows a fully differential transconductor replica feedback transconductor circuit according to embodiments of the invention.

It should be appreciated that TRF transconductor 200 of embodiments comprises a double-ended circuit configuration, wherein transconductance transistor Q1 is disposed in a common emitter transistor pair configuration with a corresponding transconductance transistor as shown in the double-ended circuit diagram f FIG. 3. However, because the double-ended circuit configuration provides mirror image circuitry and thus corresponding operation, the concepts of the invention are described herein with reference to FIG. 2, showing only one side of the double-ended circuit, in order to simplify the discussion. One of ordinary skill in the art will readily understand the operation of the full circuit from a discussion of the circuit illustrated in FIG. 2.

Low-power, highly linear transconductance operation is provided according to embodiments of the invention by reducing the "current swing" through transconductance transistor Q1. According the TRF block of embodiments of the invention operates to provide current swing in the corresponding bias transistor(s) (e.g., bias transistors M4 and M2) to reduce the current swing through the transconductance transistor. The illustrated embodiment thus disposes feedback transistor Q4 as a replica of transconductance transistor Q1 (i.e., the feedback transistor is disposed to appear to an input node of the transconductor circuit as the transconductance transistor and is thus is disposed as a replica). Accordingly, the TRF block provides enhanced looking-in degeneration impedance for the transconductor circuit, thereby allowing for higher linearity.

Feedback transistor Q4 of embodiments is not only disposed as a replica of transconductance transistor Q1, but is also configured to perform as a replica of transconductance transistor Q1. For example, feedback transistor Q4 of embodiments is provided using a same technology (e.g., bipolar, FET, etc.) and having corresponding operating characteristics (e.g., PNP, NPN, amplification factor, transconductance, etc.). It should be appreciated that the provision of circuitry operable to perform as a replica, whether or not disposed as a replica, may be utilized in providing TRF according to embodiments of the invention.

Although additional circuitry is associated with the TRF block of the illustrated embodiment, the configuration of the TRF block is preferably adapted to nevertheless provide lower power operation as compared to a similar transconductor of the prior art (e.g., transconductor 100 of FIG. 1). For example, embodiments of the invention utilize a configuration of feedback transistor Q4 having a reduced performance ratio (e.g., 1:M) with respect to transconductance transistor Q1. That is, although feedback transistor Q4 may be configured to perform as a replica of transconductance transistor Q1, various of the corresponding operating characteristics (e.g., amplification factor, transconductance, etc.) may be provided in a reduced performance ratio (i.e., the ratio of the performance factors of the feedback transistor to the transconductance transistor may be 1:M). Accordingly, the reduced current operation of transconductance transistor Q1 is not associated with a corresponding use of current by the TRF block, but instead only a small portion of the reduced current operation is consumed by the TRF block. The TRF block of embodiments, therefore, allows for higher linearity and lower power at the same time.

In the replica configuration of feedback transistor Q4 of the TRF block circuit configuration in FIG. 2, transconductor transistor Q1 output current swing is sensed by feedback transistor Q4. In operation according to embodiments, the output current swing as sensed by feedback transistor Q4 is amplified (i.e., M4;M2*R3) by the TRF block. If infinite loop gain were provided by the TRF block circuit all of the AC current due to the output voltage swing would be absorbed by the bias transistors (M4;M2) of TRF transconductor 200 and thus the current swing through transconductance transistor Q1 would be zero (i.e., a perfectly linear transconductor). However, due to there being finite gain in a circuit implementation, the current swing through transconductance transistor Q1 is reduced by a factor of the loop gain in operation according to embodiments of the invention. As will be better appreciated from the discussion which follows, even with such finite gain embodiments of TRF transconductors herein provide highly linear operation in combination with low-power operation.

In order to better understand the operation of TRF transconductors of embodiments herein, assume that for a voltage (Ve) swing at the emitter/source of the transconductor the total current swing through it (dI) would be Vout/R2. Also assume that the current swing through transconductance transistor Q1 is dI1, the current swing through bias transistor M4 is dI4, and the current swing through bias transistor M2 is dI2. The AC current taken by bias transistors M4;M2 may thus be expressed as dI4+dI2=dI1/M*R3*(gm4+gm2), where M is the performance ratio as between transconductance transistor Q1 and feedback transistor Q4, R3 is the resistance of transimpedance resistor R3, gm4 is the transconductance of bias transistor M4, and gm2 is the transconductance of bias transistor M2. Solving this equation further gives:

$$dI4+dI2=dI1/M*R3*(gm4+gm2)$$

$$=dI1*(R3*(gm4*gm2)/M)$$

thus $$dI=dI1+dI1*(R3*(gm4*gm2)/M); \text{ and}$$

$$dI1=dI/(1+R3*(gm4*gm2)/M).$$

As can be appreciated from the foregoing, the transconductance replica feedback configuration of embodiments herein improves distortion performance as if the de-generating resistor (degeneration resistor Re) were replaced with a larger de-generating resistor. The effective degeneration resistance (Re') may be expressed as:

$$Re'=Re*(1+gm2*R3/M*(M+1)/M))$$

while the looking-in impedance at the emitter/source is decreased from 1/gm1 to $$1/\{gm1*(M+1)/M*(1+gm2*R3/M)\}.$$

In operation, feedback transistor Q4 sensing current swings in transconductance transistor Q1 causes the current in the gate of bias transistor M2 to swing such that it cancels, or substantially cancels, the swing in current at transconductance transistor Q1 and thus tries to maintain a constant current through Q1. Specifically, once feedback transistor Q4 senses a change in the current through transconductance transistor Q1, feedback transistor Q4 converts that change in current into a voltage using transimpedance resistor R3. The foregoing voltage, corresponding to the change in current in transconductance transistor Q1, is fed to the gate of bias transistor M2 to control an offsetting change in the current therein operable to cancel the change in current at transconductance transistor Q1.

Although the effective transconductance (gm) for signal gain is reduced due to degeneration effect by the increased effective de-generation (Re'), loss of DC gain can be re-gained through the use of a larger resistor in the TRF block (e.g., transimpedance resistor R3) since higher distortion performance is achieved with the seemingly higher de-generation resistance and without the noise penalty of an otherwise higher resistor. In particular, utilizing a relatively high resistance configuration of transimpedance resistor R3 reduces the current in the limb for the same IR drop across the load such that a higher gain is provided with a lower current in feedback transistor Q4. Ideally, the resistance of transimpedance resistor R3 would be selected to be very high in order to provide a very high loop gain and thus very high distortion performance. However, the selection of the resistance of the transimpedance resistor R3 should be selected with other considerations in mind, such as the bandwidth of the circuit, the amount of headroom available above feedback transistor Q4, etc.

A transimpedance resistor of suitably high resistance may be utilized to provide the DC gain as before while reducing power consumption by the transconductor. Accordingly, the configuration of transconductor 200 reduces power consumption while keeping distortion performance the same or better, all without increasing the degeneration resistor and therefore the noise.

Figure 4:
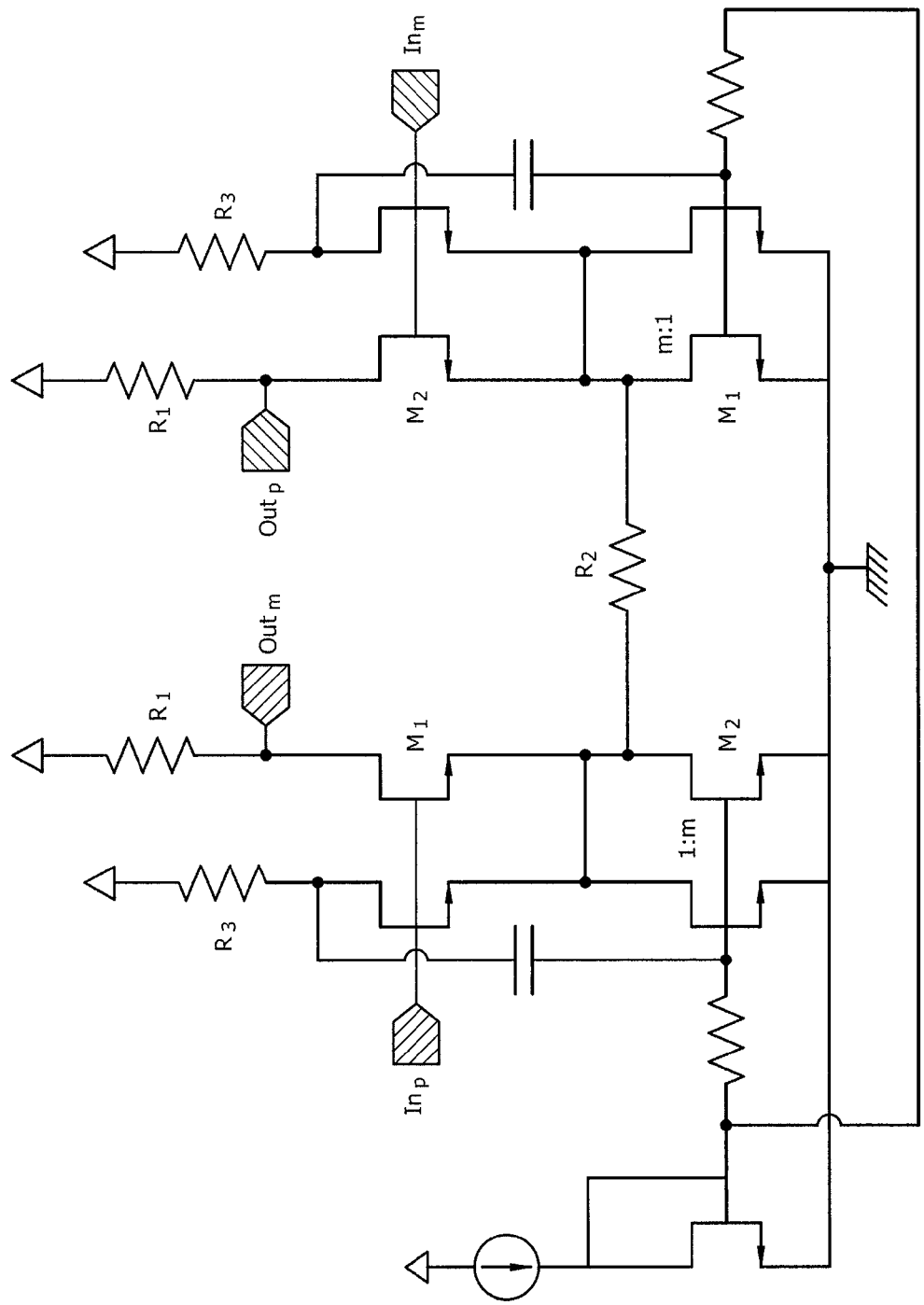
FIG. 4 shows a fully differential transconductor replica feedback transconductor circuit according to alternative embodiments of the invention.

Although embodiments are shown herein as comprising bipolar transistors as the transconductance transistor and feedback transistor and FET transistors as the bias transistors, the concepts of the present invention are not limited to the particular embodiments illustrated. For example, FET transistors may be used as the transconductance transistor and feedback transistor and/or bipolar transistors may be used as the bias transistors according to embodiments of the invention. Directing attention to FIG. 4, an embodiment of a transconductor replica feedback transconductor circuit wherein all FET transistors are used is shown.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transconductor circuit comprising:
a transconductance transistor; and
a feedback transistor, wherein the feedback transistor is provided in the transconductor circuit as a replica of the transconductor transistor, wherein the feedback transistor is both disposed as a replica of the transconductance transistor and configured to perform as a replica of the transconductance transistor, and wherein the feedback transistor is operable to sense current change in the transconductance transistor and to control a corresponding current change in another transistor of the transconductor circuit to offset the sensed current change.

2. A transconductor circuit comprising:
a transconductance transistor; and
a feedback transistor, wherein the feedback transistor is provided in the transconductor circuit as a replica of the transconductor transistor, wherein the feedback transistor is both disposed as a replica of the transconductance transistor and configured to perform as a replica of the transconductance transistor, and wherein the feedback transistor is operable to provide an effective de-generating resistance which is higher than that of a degeneration resistor coupled to the transconductance transistor.

3. The transconductor circuit of claim 1, wherein the another transistor comprises a bias transistor operable to bias the transconductance transistor.

4. The transconductor circuit of claim 1, wherein the feedback transistor disposed as a replica of the transconductance transistor is disposed to appear to an input node of in the transconductor circuit as a replica of the transconductance transistor.

5. The transconductor circuit of claim 4, wherein the feedback transistor configured to perform as a replica of the transconductance transistor is configured so that various operating characteristics of the feedback transistor are provided in a reduced performance ratio with respect to corresponding operating characteristics of the transconductance transistor.

6. The transconductor circuit of claim 1, further comprising:
 a transimpedance resistor coupled to the feedback transistor.

7. The transconductor circuit of claim 6, wherein the transimpedance resistor is operable to increase a loop gain of the transconductor circuit.

8. The transconductor circuit of claim 6, wherein the transimpedance resistor is operable to reduce current in the feedback transistor.

9. A system comprising:
 a transconductor circuit having a transconductor replica feedback block therein, wherein the transconductor replica feedback block is operable to sense current change in a first component of the transconductor circuit and to control a corresponding current change in a second component of the transconductor circuit to offset the sensed current change, wherein a feedback component of the transconductor replica feedback block is provided as a replica of the first component, wherein the first component comprises a transconductance transistor, the second component comprises a bias transistor, and the feedback component comprises a feedback transistor.

10. The system of claim 9, wherein the feedback component is disposed as a replica of the first component.

11. The system of claim 10, wherein the feedback component is disposed to appear to an input node of the transconductor circuit as the first component.

12. The system of claim 9, wherein the feedback component is configured to perform as a replica of first component.

13. The system of claim 12, wherein the feedback component is configured to have a reduced performance ratio with respect to the first component.

14. The system of claim 9, further comprising:
 a transimpedance resistor coupled to the feedback transistor.

15. The system of claim 14, wherein the transimpedance resistor is operable to increase a loop gain of the transconductor circuit.

16. The system of claim 14, wherein the transimpedance resistor is operable to reduce current in the feedback transistor.

17. A method comprising:
 providing a transconductor replica feedback block in a transconductor circuit;
 sensing changes in current in a transconductance transistor of the transconductor circuit, wherein the transconductor replica feedback block is operable to provide the sensing changes in current in the transconductance transistor; and
 controlling a corresponding current change in another transistor of the transconductor circuit to offset the sensed current change.

18. The method of claim 17, wherein the another transistor of the transconductor circuit comprises a bias transistor operable to bias the transconductance transistor.

19. The method of claim 17, wherein the controlling comprises:
 feeding back a voltage to an input of the another transistor, wherein the feedback voltage is proportional to the changes in current sensed in the transconductance transistor.

20. The method of claim 17, wherein the providing a transconductor replica feedback block comprises:
 disposing a feedback transistor as a replica of the transconductance transistor.

21. The method of claim 20, wherein the feedback transistor is configured to perform as a replica of the transconductance transistor.

* * * * *

UNITED STATES PATENT AND TRADEMARK OFFICE
CERTIFICATE OF CORRECTION

PATENT NO. : 8,604,872 B2
APPLICATION NO. : 13/308145
DATED : December 10, 2013
INVENTOR(S) : Ayaskant Shrivastava It is certified that error appears in the above-identified patent and that said Letters Patent is hereby corrected as shown below:

In the Specification:

At column 1, line number 25, delete "Tout" and replace with --Iout--.
At column 1, line number 37, delete "Tout" and replace with --Iout--.
At column 2, line number 52, delete "TRY" and replace with --TRF--.
At column 3, line number 34, delete "Tout" and replace with --Iout--.
At column 5, line number 13, delete "dIl/M" and replace with --dI1/M--.

Signed and Sealed this
Twenty-fifth Day of March, 2014

Michelle K. Lee
*Deputy Director of the United States Patent and Trademark Office*